(12) United States Patent
Kikutake et al.

(10) Patent No.: US 7,227,801 B2
(45) Date of Patent: Jun. 5, 2007

(54) SEMICONDUCTOR MEMORY DEVICE WITH RELIABLE FUSE CIRCUIT

(75) Inventors: Akira Kikutake, Kawasaki (JP); Shigemasa Ito, Kawasaki (JP); Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/113,017

(22) Filed: Apr. 25, 2005

(65) Prior Publication Data

US 2005/0190618 A1    Sep. 1, 2005

Related U.S. Application Data

(63) Continuation of application No. PCT/JP03/05202, filed on Apr. 23, 2003.

(51) Int. Cl.
G11C 8/00 (2006.01)
G11C 5/02 (2006.01)
G11C 17/14 (2006.01)
G11C 29/24 (2006.01)

(52) U.S. Cl. .............................. 365/225.7; 365/230.08; 365/51; 365/200; 365/195

(58) Field of Classification Search ........... 365/189.05, 365/195, 200, 225.7, 230.04, 230.08, 96, 365/51, 63
See application file for complete search history.

(56) References Cited

U.S. PATENT DOCUMENTS 5,773,869 A 6/1998 Froehner
5,933,714 A 8/1999 Froehner
5,986,321 A 11/1999 Froehner
5,991,211 A 11/1999 Kato et al.
6,016,265 A * 1/2000 Yoshida et al. ............... 365/96
6,272,061 B1 * 8/2001 Kato et al. ............... 365/225.7
6,314,011 B1 * 11/2001 Keeth et al. ................... 365/51
6,388,941 B2 * 5/2002 Otori et al. ............ 365/230.08
2002/0093860 A1 7/2002 Kata et al.
2003/0026159 A1 * 2/2003 Frankowsky et al. ..... 365/225.7

FOREIGN PATENT DOCUMENTS

| JP | 07201198 A | 8/1995 |
| JP | 08236631 A | 9/1996 |
| JP | 11135754 A | 5/1999 |
| JP | 2002076121 A | 3/2002 |
| JP | 2002208294 A | 7/2002 |

* cited by examiner

Primary Examiner—J. H. Hur
(74) Attorney, Agent, or Firm—Arent Fox LLP.

(57) ABSTRACT

A semiconductor memory device includes a plurality of first fuse latch circuits configured to provide redundancy to first addresses, a plurality of second fuse latch circuits configured to provide redundancy to second addresses, and a nullifying circuit configured to make the plurality of second fuse latch circuits ineffective, wherein first fuse positions corresponding to the plurality of first fuse latch circuits intervene between second fuse positions corresponding to the plurality of second fuse latch circuits.

6 Claims, 6 Drawing Sheets

SEMICONDUCTOR MEMORY DEVICE WITH RELIABLE FUSE CIRCUIT

CROSS-REFERENCE TO RELATED APPLICATION

This is a continuation of International Application No. PCT/JP2003/05202, filed on Apr. 23, 2003, the entire contents of which are hereby incorporated by reference.

BACKGROUND OF THE INVENTION

1. Field of the Invention

The present invention generally relates to semiconductor memory devices, and particularly relates to a semiconductor memory device in which fuses provide settings for replacing defective addresses with redundant memory cells.

2. Description of the Related Art

In semiconductor memory devices, defective memory cells, if present, are replaced with redundant memory cells that serve as spare memory cells. Access to the addresses of the defective memory cells is switched over and directed to the redundant memory cells, thereby recovering the addresses of the defective memory cells. Semiconductor memory devices having large memory capacity are required to have high redundancy efficiency (defect recovery efficiency) in order to recover as many defects as possible. The redundancy efficiency can be increased by such a straightforward means as increasing the number of spares (redundant cells). On the other hand, however, it is also required to reduce the area size of a defect recovery system such as redundancy cells and redundancy circuitry and to improve the reliability of the redundancy system.

In order to replace defective memory cells with redundant memory cells, the addresses of the defective memory cells need to be recorded. Typical redundancy systems achieve this by providing fuses. Each fuse is associated with a latch circuit that serves to indicate the status of the fuse (severed/intact). In order to recover defective memory cells, spare column selecting lines and spare word lines are provided, for example, and a column selecting line and word line corresponding to a defective memory cell is replaced with a spare column selecting line and spare word line. Such implementation requires fuse latch circuits that store addresses with respect to both the column selecting line and the word line corresponding to the defective memory cell.

If a column selecting address is comprised of five bits, for example, five fuse latch circuits and one redundancy-check fuse latch circuit are provided. If a word selecting address is comprised of five bits, for example, five fuse latch circuits and one redundancy-check fuse latch circuit are provided. Here, the redundancy-check fuse latch circuit serves to indicate whether the corresponding spare column selecting line or corresponding spare word line is used or not. A set including the fuse latch circuits for storing addresses and the redundancy-check fuse latch circuit will hereinafter be referred to as a fuse set.

Fuses are severed with respect to defective addresses. Information about the severed fuses is supplied to the redundancy circuit via the fuse latch circuits, and is further supplied from the redundancy circuit to decoder circuits and driver circuits relating to column selecting lines and word lines. Based on this information, column selecting lines and word lines corresponding to the defective addresses are replaced with spare column selecting lines and spare word lines, which results in the defective memory cells being replaced.

In order to increase the redundancy efficiency (defect recovery efficiency), the spare column selecting lines and spare word lines may be doubled in number. This results in a need for twice as many fuse sets, which means twice as many fuse latch circuits. Fuse latch circuits are generally arranged in line, and corresponding fuses are also arranged in line. Pitches at which the fuse latch circuits are arranged are generally determined according to the fuse pitch.

If fuse sets are increased in number, the redundancy efficiency will proportionately be improved. However, this results in an increased number of fuses and fuse latch circuits, which contributes to an increase in area size. Since the pitches of fuse latch circuits are generally controlled by the fuse pitch, narrowing the fuse pitch makes it possible to decrease an area size penalty. Severing of fuses, however, requires the use of a laser beam. The smaller the fuse pitch, the higher the risk of having the severed fuse short-circuited to an adjacent fuse. Accordingly, while it is possible to narrow the fuse pitch to increase the redundancy efficiency and at the same time decrease an area size penalty, the reliability of fuses is sacrificed.

SUMMARY OF THE INVENTION

It is a general object of the present invention to provide a semiconductor memory device that substantially obviates one or more problems caused by the limitations and disadvantages of the related art.

It is another and more specific object of the present invention to maintain fuse reliability while narrowing fuse pitches in a semiconductor memory device.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device, which includes a plurality of first fuse latch circuits configured to provide redundancy to first addresses, a plurality of second fuse latch circuits configured to provide redundancy to second addresses, and a nullifying circuit configured to make the plurality of second fuse latch circuits ineffective, wherein first fuse positions corresponding to the plurality of first fuse latch circuits intervene between second fuse positions corresponding to the plurality of second fuse latch circuits.

In the manufacturing of semiconductor memory devices, generally, a yield rate is higher and the number of defects is smaller at the time of mass production than at the time of prototyping (evaluation). It follows that the redundancy efficiency needs to be high in order to recover a large number of defects at the time of prototyping while there is no need for high redundancy efficiency but a stronger need for fuse reliability at the time of mass production because of fewer defects. In the semiconductor memory device described above, the second fuse latch circuits are made ineffective at the time of mass production, so that every other fuse is made unused (ineffective), for example. This effectively doubles the pitch of the used fuses (effective fuses). Accordingly, it is possible to improve the reliability of fuses by avoiding defects caused by narrow pitches such as short-circuiting between the used fuses.

In this manner, provision is made to select used fuses and unused fuses by use of circuitry means. This makes it possible to maintain fuse reliability while narrowing fuse pitches.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
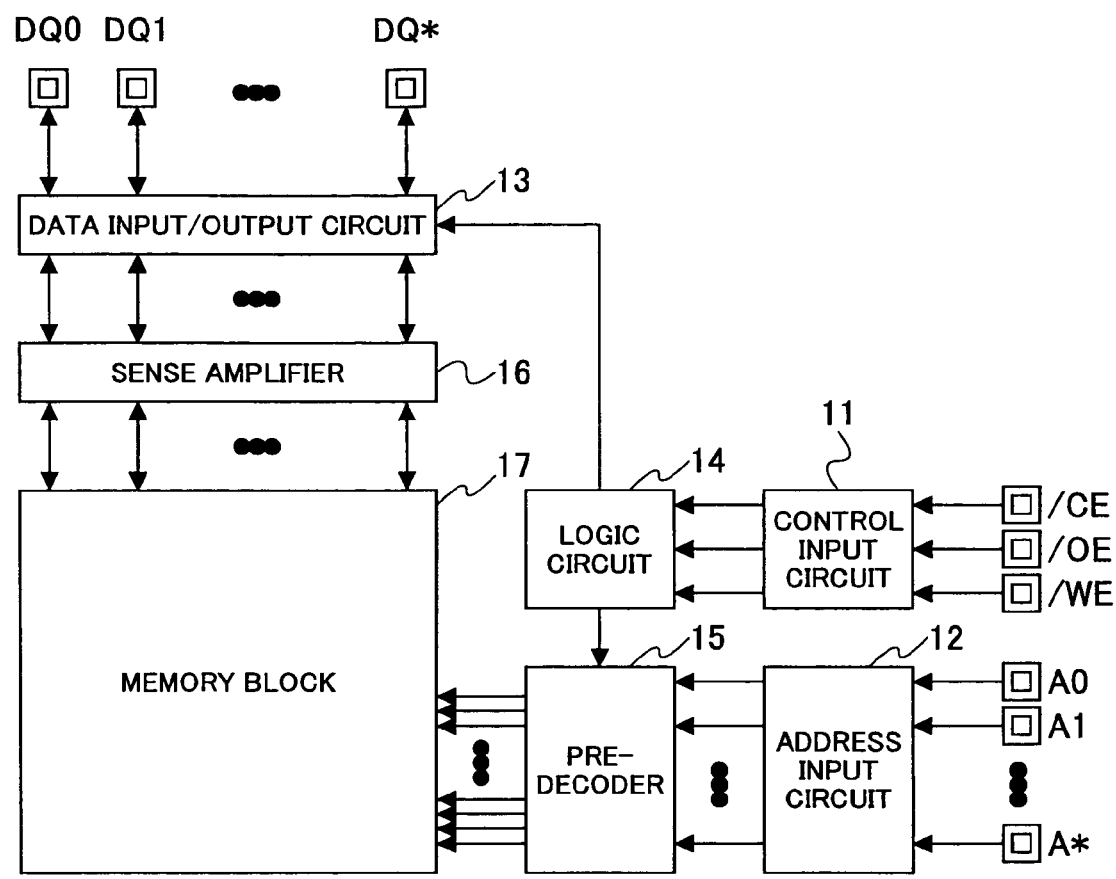
FIG. 1 is a block diagram showing a schematic configuration of a semiconductor memory device to which the present invention is applied.

FIG. 1 is a block diagram showing a schematic configuration of a semiconductor memory device to which the present invention is applied.

A semiconductor memory device 10 of FIG. 1 includes a control input circuit 11, an address input circuit 12, a data input/output circuit 13, a logic circuit 14, a pre-decoder 15, a sense amplifier 16, and a memory block 17.

The logic circuit 14 receives control signals (chip-enable signal /CE, output-enable signal /OE, write-enable signal /WE) from an exterior via the control input circuit 11, and serves as a control circuit for controlling each part of the semiconductor memory device 10 based on the control signals. To be specific, the logic circuit 14 decodes the control signals, and controls the data input/output circuit 13, the pre-decoder 15, and the memory block 17 based on the decoded results.

The address input circuit 12 latches an address signal received from the exterior, and supplies the latched address signal to the pre-decoder 15. The pre-decoder 15 operates under the control of the logic circuit 14 to pre-decode the address signal, followed by supplying the pre-decoded results to the memory block 17. In the memory block 17, the pre-decoded results are further decoded, and a read/write access operation is performed with respect to the memory cells indicated by the decoded address.

The data input/output circuit 13 supplies data to the exterior as the data is read from the memory cell array of the memory block 17, and supplies write data to the memory block 17 as the write data is supplied from the exterior. The sense amplifier 16 amplifies signals when data is transmitted between the data input/output circuit 13 and the memory block 17.

Figure 2:
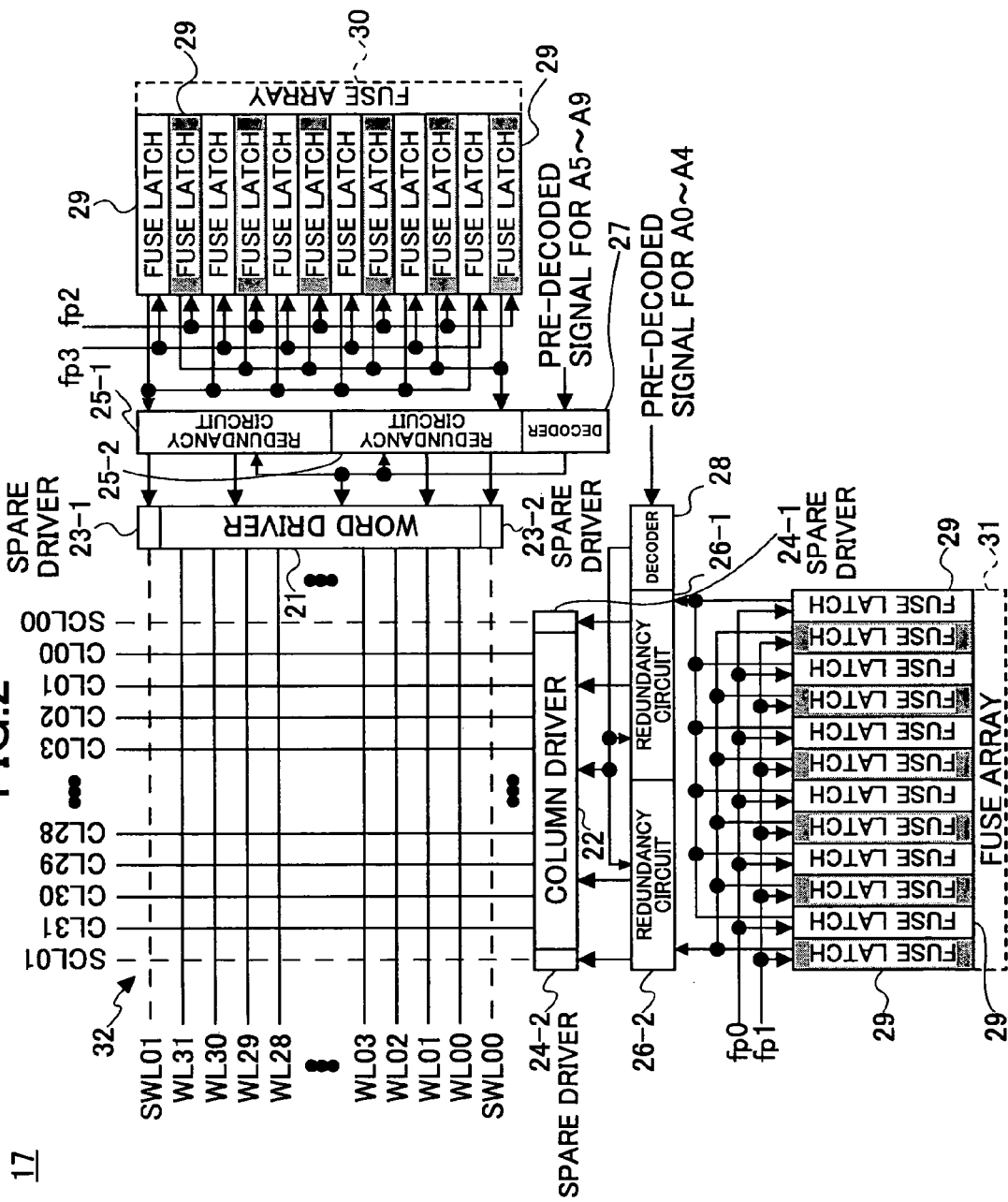
FIG. 2 is a drawing showing the configuration of a first embodiment of a memory block.

FIG. 2 is a drawing showing the configuration of a first embodiment of the memory block 17.

The memory block 17 shown in FIG. 2 includes a word driver 21, a column driver 22, spare drivers 23-1 and 23-2 provided for word lines, spare drivers 24-1 and 24-2 provided for column selecting lines, redundancy circuits 25-1 and 25-2 provided for the word lines, redundancy circuits 26-1 and 26-2 provided for the column selecting lines, a word decoder 27, a column decoder 28, a plurality of fuse latch circuits 29, a fuse array 30, a fuse array 31, and a memory core circuit 32.

The word decoder 27 receives a pre-decoded signal corresponding to the upper-order address bits (e.g. A5 through A9) from the pre-decoder 15 shown in FIG. 1, and decodes the received pre-decoded signal. The decoded result indicative of a selected word is supplied to the redundancy circuits 25-1 and 25-2 and the word driver 21. The column decoder 28 receives a pre-decoded signal corresponding to the lower-order address bits (e.g. A0 through A4) from the pre-decoder 15 shown in FIG. 1, and decodes the received pre-decoded signal. The decoded result indicative of a selected column is supplied to the redundancy circuits 26-1 and 26-2 and the column driver 22.

The word driver 21 selectively activates a word line WL corresponding to the selected word. The column driver 22 selectively activates a column selecting line CL corresponding to the selected column. Provision is thus made to exchange, with the sense amplifier 16 of FIG. 1, data of a memory cell specified by the activated column selecting line among the memory cells connected to the activated word line. A data read/write operation is thus performed with respect to the memory cells corresponding to the selected address.

The fuse array 30 concerning the redundancy of word addresses includes a plurality of fuses arranged in line. Further, the fuse latch circuits 29 are provided in one-to-one correspondence with the fuses. Odd-number fuse latch circuits 29 are connected to the redundancy circuit 25-1 as one fuse set, for example, and even-number fuse latch circuits 29 are connected to the redundancy circuit 25-2 as another fuse set. The redundancy circuit 25-1 exercises redundancy control if the decoded result of a word address supplied from the word decoder 27 matches a word address indicated by the odd-number fuse latch circuits 29. That is, the redundancy circuit 25-1 exercises such control that the word driver 21 refrains from selecting a word line of the above-noted word address, and that the spare driver 23-1 selectively activates a spare word line SWL01. Further, the redundancy circuit 25-2 exercises redundancy control if the decoded result of a word address supplied from the word decoder 27 matches a word address indicated by the even-number fuse latch circuits 29. That is, the redundancy circuit 25-2 exercises such control that the word driver 21 refrains from selecting a word line of the above-noted word address, and that the spare driver 23-2 selectively activates a spare word line SWL00.

The same applies in the case of redundancy control concerning column addresses. The redundancy circuit 26-1 exercises redundancy control if the decoded result of a column address matches a column address indicated by the odd-number fuse latch circuits 29. Further, the redundancy circuit 26-2 exercises redundancy control if the decoded result of a column address matches a column address indicated by the even-number fuse latch circuits 29.

Figure 3:
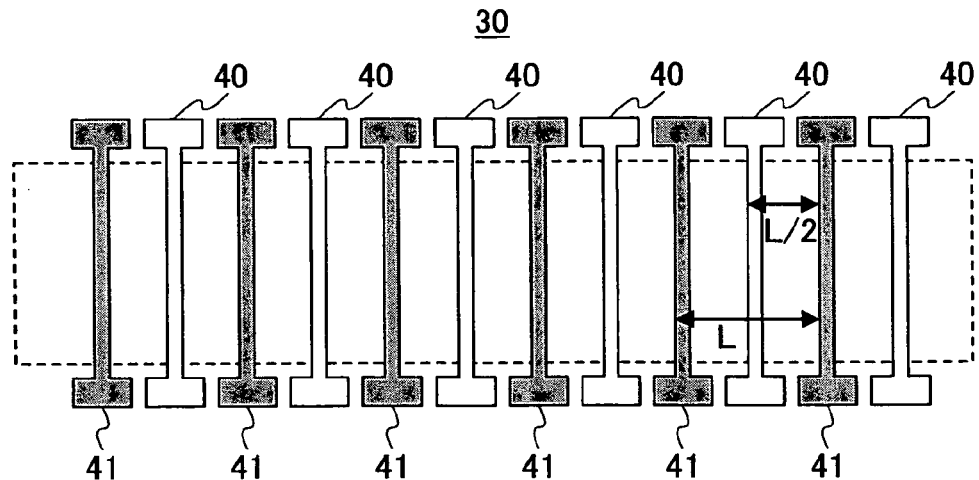
FIG. 3 is an illustrative drawing showing the configuration of a fuse array.

FIG. 3 is an illustrative drawing showing the configuration of the fuse array 30. The fuse array 31 also has the same configuration as that shown in FIG. 3.

The fuse array 30 shown in FIG. 3 has fuses 40 and fuses 41 alternately arranged. The odd-number fuses 40 correspond to the odd-number fuse latch circuits 29, and the even-number fuses 41 correspond to the even-number fuse latch circuits 29. The fuse pitch defined as an interval between adjacent fuses is L/2.

Figure 4:
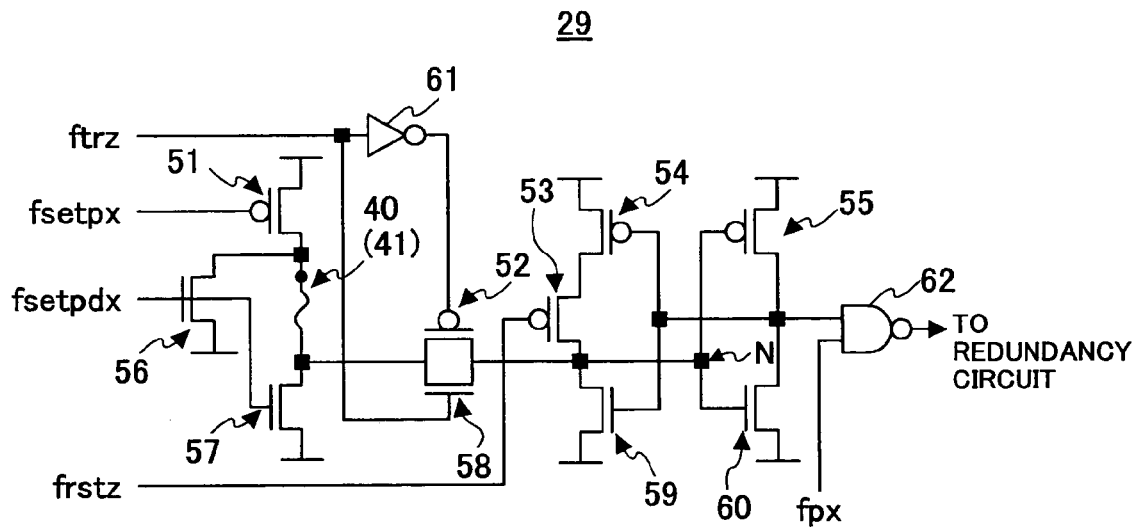
FIG. 4 is a circuit diagram showing an example of the configuration of a fuse latch circuits.

FIG. 4 is a circuit diagram showing an example of the configuration of the fuse latch circuits 29.

The fuse latch circuits 29 shown in FIG. 4 includes PMOS transistors 51 through 55, NMOS transistors 56 through 60, an inverter 61, and a NAND gate 62. One of the fuses 40 (or 41) is provided between the PMOS transistor 51 and the NMOS transistor 57. The PMOS transistors 54 and 55 and NMOS transistors 59 and 60 together constitute a latch that stores 1-bit information about fuse severance.

A signal frstz is set to LOW, and a signal ftrz is set to HIGH. Then, a signal fsetpx is set to LOW, and a signal fsetpdx is set to HIGH. As a result, data having HIGH at a node N is stored in the latch if the fuse 40 is intact. If the fuse 40 is severed, data having LOW at the node N is stored in the latch. The data stored in the latch is supplied to the redundancy circuit via the NAND gate 62 if a signal fpx is HIGH. The signal fpx is one of the signals fp0, fp1, fp2, and fp3 shown in FIG. 2. As is understood from FIG. 2, the same signal fpx is supplied to every other one of the fuse latch circuits 29, which are arranged in line.

The signal fpx is set to LOW when the corresponding fuses of the fuse latch circuits 29 are not to be selected. Since the same signal fpx is supplied to every other one of the fuse latch circuits 29 arranged in line, the setting to LOW of one of the signals fp0 and fp1 in FIG. 2 results in only every other one of the fuse latch circuits 29 being relevant in terms of column address selection. Namely, among the fuses 40 and the fuses 41 arranged in line as shown in FIG. 3, either the fuses 40 or the fuses 41 are effective fuses (relevant fuses used for redundancy). The fuse pitch in this case thus becomes L.

With the fuse pitch being L, the risk of having the severed fuse short-circuited to an adjacent fuse at the time of fuse cut is lower than in the case of the fuse pitch being L/2. This makes it possible to maintain a highly reliable nature of the fuses. If high redundancy efficiency is desired (e.g., as in the prototyping and evaluation stage of a device prior to shipment from factory), settings may be made such that all the fuses are relevant. That is, all the fpx signals are set to HIGH. IF high reliability of the fuses is desired (e.g., as in the phase of mass-production), part of the fpx signals is set to LOW, thereby providing effective fuses (relevant fuses used for redundancy control) only at every other position.

In this manner, provision is made to select either using all the fuses or using every other fuse according to need. In the description provided above, two spare drivers are provided, so that every other fuse is made effective (used in redundancy control). Alternatively, three or more spare drivers may be provided, so that one in every predetermined number (more than two) of fuses is made effective.

Figure 5:
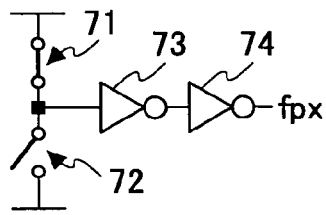
FIG. 5 is a circuit diagram showing an example of a circuit for generating a signal that controls the effective/ineffective state of fuse latch circuits.

FIG. 5 is a circuit diagram showing an example of the circuit for generating the signal fpx that controls the effective/ineffective state of fuse latch circuits.

The fpx signal generating circuit of FIG. 5 includes option switches 71 and 72 and inverters 73 and 74. If the option switch 71 is disconnected and the option switch 72 is connected, the output signal fpx is set to LOW. If the option switch 72 is disconnected and the option switch 71 is connected, on the other hand, the output signal fpx is set to HIGH. The option switches 71 and 72 are made of the same material (same layer) as the metal that constitutes the fuses.

The fuses that are selected as unused (ineffective) following the completion of prototype testing may be removed from the circuit layout at the mass-production stage. In this case, there is a need to create a new reticle for the mass-production purpose separately from the reticle used for the purpose of producing the prototype device. Further, there is also a need to create a reticle in which the option switches are changed. If the fuses and the option switches are formed by use of the same material of the same layer as described above, only one reticle needs to be newly produced. This reduces the associated costs.

Figure 6:
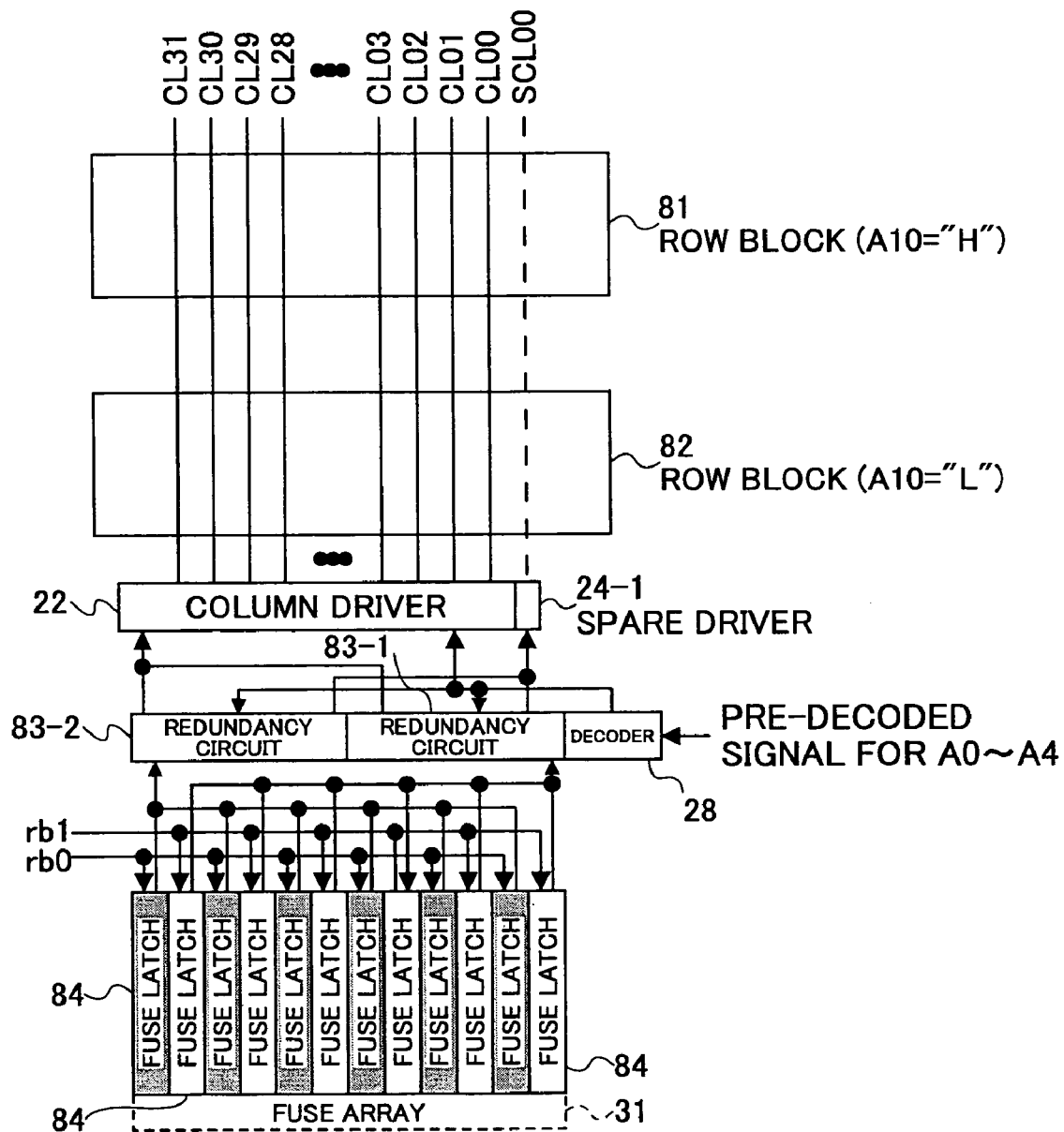
FIG. 6 is a drawing showing the configuration of a second embodiment of a memory block.

FIG. 6 is a drawing showing the configuration of a second embodiment of the memory block 17. In FIG. 6, the same elements as those of FIG. 2 are referred to by the same numerals, and a description thereof will be omitted.

The memory block 17 of FIG. 6 includes the column driver 22, the spare driver 24-1 provided for column selecting lines, redundancy circuits 83-1 and 83-2 provided for the column selecting lines, the column decoder 28, a plurality of fuse latch circuits 84, the fuse array 31, and row blocks 81 and 82. In FIG. 6, only the configuration of a column system in the memory block 17 is illustrated. The configuration of a word system is included in each of the row blocks 81 and 82.

Figure 7:
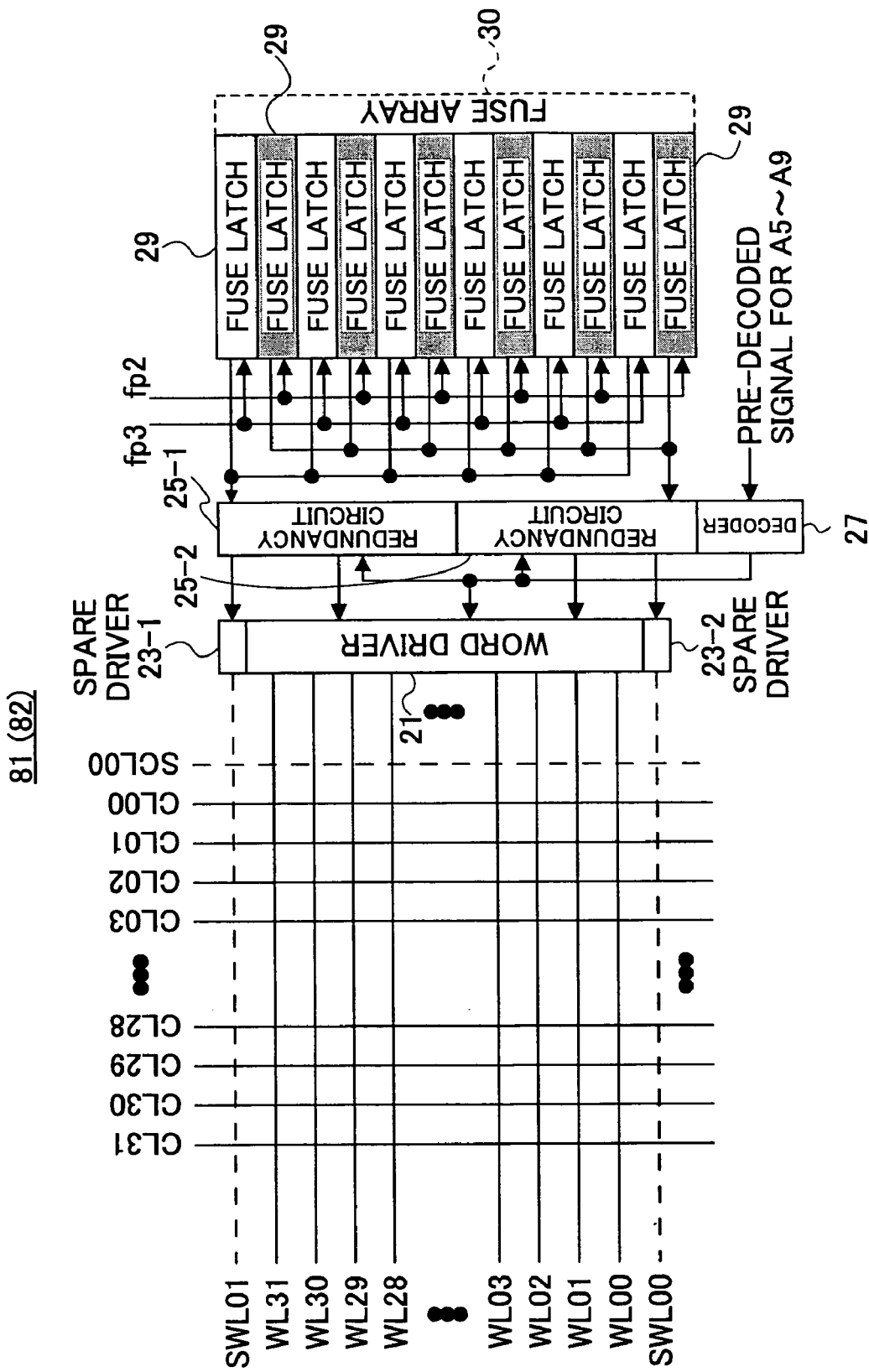
FIG. 7 is a drawing showing the configuration of the word system in the second embodiment of the memory block.

FIG. 7 is a drawing showing the configuration of the word system in the second embodiment of the memory block 17. FIG. 7 illustrates such configuration corresponding to one row block. The configuration shown in FIG. 7 is provided separately for each of the row blocks 81 and 82.

The row block of FIG. 7 includes the word driver 21, the spare drivers 23-1 and 23-2 provided for word lines, the redundancy circuits 25-1 and 25-2 provided for the word lines, the word decoder 27, the fuse latch circuits 29, and the fuse array 30. The configuration shown in FIG. 7 is the same as the configuration of the word system in the memory block 17 shown in FIG. 2. The same elements as those of FIG. 2 are referred to by the same numerals, and a description thereof will be omitted.

In the second embodiment shown in FIG. 6 and FIG. 7, column selecting lines CL extend over the two row blocks 81 and 82, and one of the row blocks 81 and 82 is selected by an address A10. By the same token, a spare column selecting line SCL extends over the two row blocks 81 and 82, thereby making it possible to exercise redundancy control on a row-block-specific basis. Namely, the column selecting line CL01 may be replaced with a spare column selecting line in the row block 81, and another column selecting line CL30 may be replaced with a spare column selecting line in the row block 82. To implement such operation, there is a need to store one address for each row block, and, thus, there is a need to store a total of two addresses for the two row blocks 81 and 82.

Compared to the first embodiment in which there are two spare column selecting lines SCL, therefore, the same number of fuse latch circuits 84 becomes necessary. The second embodiment shown in FIG. 6 is configured such that the fuse latch circuits 84 in the row block 81 and the fuse latch circuits 84 in the row block 82 are alternately arranged. To be consistent with this, the fuses 40 in FIG. 3 correspond to the row block 81, for example, and the fuses 41 correspond to the row block 82, and the fuses 40 and the fuses 41 alternate with each other.

The redundancy circuit 83-1 is connected to the odd-number fuse latch circuits 84, and exercises redundancy control if the decoded result of a column address matches a column address indicated by the odd-number fuse latch circuits 84. Further, the redundancy circuit 83-2 is connected to the even-number fuse latch circuits 84, and exercises redundancy control if the decoded result of a column address matches a column address indicated by the even-number fuse latch circuits 84. The odd-number fuse latch circuits 84 becomes effective only when the row block 81 is selected, and the even-number fuse latch circuits 84 becomes effective only when the row block 82 is selected.

Figure 8:
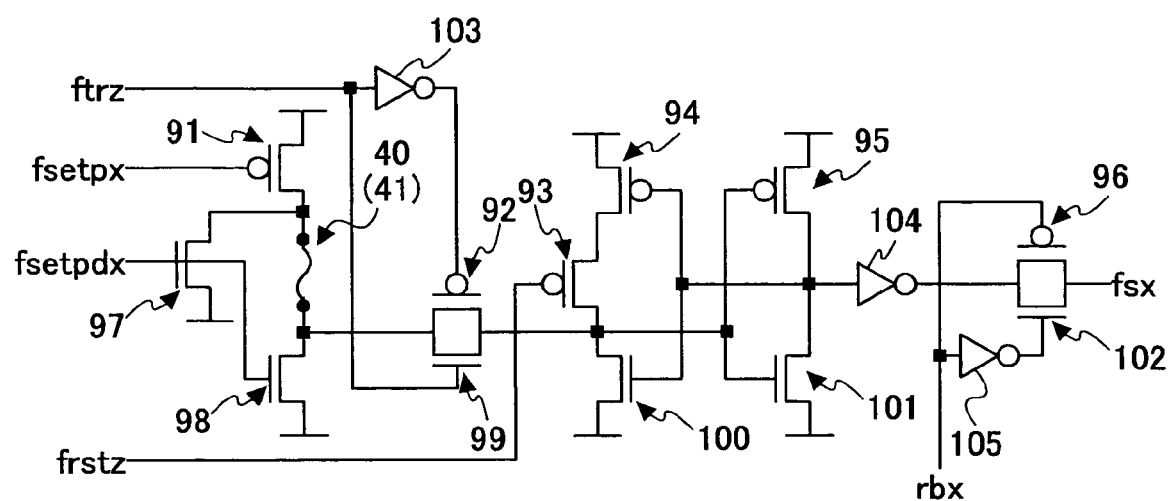
FIG. 8 is a circuit diagram showing an example of the configuration of a fuse latch circuit.

FIG. 8 is a circuit diagram showing an example of the configuration of the fuse latch circuit 84.

The fuse latch circuit 84 of FIG. 8 includes PMOS transistor 91 through 96, NMOS transistor 97 through 102, and inverters 103 through 105. One of the fuses 40 (or 41) is provided between the PMOS transistor 91 and the NMOS transistor 98. The PMOS transistors 94 and 95 and NMOS transistors 100 and 101 together constitute a latch that stores 1-bit information about fuse severance.

The PMOS transistor 96 and the NMOS transistor 102 are connected in parallel, thereby constituting a transfer gate. This transfer gate controls whether the data stored in the above-noted latch is output or not. The opening/closing of the transfer gate is controlled by a signal rbx (x=1 or 2). Except for the control of the output by the transfer gate, the operation of the fuse latch circuit 84 is the same as the operation of the fuse latch circuit 29 shown in FIG. 4.

Figure 9:
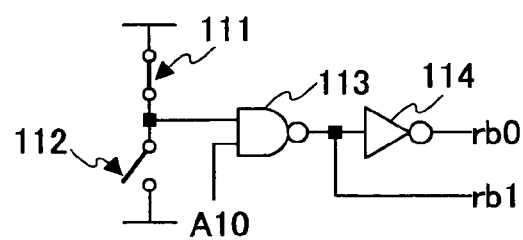
FIG. 9 is a circuit diagram showing an example of a circuit that generates a signal for controlling the effective/ineffective status of a fuse latch circuit.

FIG. 9 is a circuit diagram showing an example of the circuit that generates the signal rbx for controlling the effective/ineffective status of a fuse latch circuit.

The rbx signal generating circuit of FIG. 9 includes option switches 111 and 112, a NAND gate 113 and inverter 114. If the option switch 111 is disconnected and the option switch 112 is connected, the output signals rb0 and rb1 are fixed to LOW and HIGH, respectively. If the option switch 111 is connected and the option switch 112 is disconnected, the output signals rb0 and rb1 depend on the address signal A10. IF the address signal A10 is HIGH, the output signals rb0 and rb1 are fixed to HIGH and LOW, respectively. IF the address signal A10 is LOW, the output signals rb0 and rb1 are fixed to LOW and HIGH, respectively. The option switches 111 and 112 are made of the same material (same layer) as the metal that forms the fuses in the same manner as in the case of FIG. 5.

In the second embodiment as described above, all the fuses are made effective and the address A10 is used for selection if high redundancy efficiency is desired. If it is desired to secure high reliability for the fuses, the option switch 111 is disconnected and the option switch 112 is connected, thereby making effective only the even-number fuses.

As is understood form the description of the first embodiment and the second embodiment, the present invention provides for a plurality of fuses belonging to a given fuse set to be arranged at spaced-apart intervals corresponding to a predetermined number regardless of the number of spares and the specific configuration of redundancy control. This makes it possible to select the used/unused state of a fuse set on a fuse-set-specific basis by use of a circuitry means, thereby improving the reliability of fuses by suppressing redundancy efficiency according to need.

Further, the present invention is not limited to these embodiments, but various variations and modifications may be made without departing from the scope of the present invention.

What is claimed is:

1. A semiconductor memory device comprising:
   a plurality of first fuse latch circuits configured to provide redundancy to first addresses;
   a plurality of second fuse latch circuits configured to provide redundancy to second addresses; and
   a nullifying circuit configured to make said plurality of second fuse latch circuits ineffective,
   wherein first fuse positions corresponding to said plurality of first fuse latch circuits intervene between second fuse positions corresponding to said plurality of second fuse latch circuits, and further wherein said nullifying circuit is configured to fix outputs of said plurality of second fuse latch circuits to a predetermined level.

2. The semiconductor memory device as claimed in claim 1, further comprising:
   fuses provided at the first fuse positions; and
   fuses provided at the second fuse positions.

3. The semiconductor memory device as claimed in claim 1, wherein said nullifying circuit includes:
   a circuit configured to control whether to generate a signal that makes said plurality of first fuse latch circuits ineffective; and
   a circuit configured to control whether to generate a signal that makes said plurality of second fuse latch circuits ineffective.

4. A semiconductor memory device comprising:
   a plurality of first fuse latch circuits configured to provide redundancy to first addresses;
   a plurality of second fuse latch circuits configured to provide redundancy to second addresses; and
   a nullifying circuit configured to make said plurality of second fuse latch circuits ineffective,
   wherein first fuse positions corresponding to said plurality of first fuse latch circuits intervene between second fuse positions corresponding to said plurality of second fuse latch circuits, and
   further comprising fuses provided at the first fuse positions, wherein fuses are absent at the second fuse positions.

5. The semiconductor memory device as claimed in claim 4, wherein said nullifying circuit includes a switch configured to control whether to generate a signal that makes said plurality of second fuse latch circuits ineffective, said switch being made of a material identical to a material of said fuses.

6. The semiconductor memory device as claimed in claim 4 wherein the first fuse positions and the second fuse positions alternate with each other in a single line.

* * * * *